United States Patent [19]

Saito

[11] Patent Number: 5,442,653

[45] Date of Patent: Aug. 15, 1995

[54] SIGNAL TRANSMITTING AND RECEIVING APPARATUS

[75] Inventor: Shin Saito, Tokyo, Japan

[73] Assignee: Sony Corporation, Japan

[21] Appl. No.: 973,098

[22] Filed: Nov. 6, 1992

[30] Foreign Application Priority Data

Nov. 8, 1991 [JP] Japan .................. 3-292596

[51] Int. Cl.$^6$ .......................... H04B 1/38; H04L 5/16
[52] U.S. Cl. .................... 375/219; 375/261; 375/271; 375/285
[58] Field of Search .............. 455/343, 19, 73, 78, 455/82, 84, 83, 186; 375/7, 39, 44, 58; 370/32, 40

[56] References Cited

U.S. PATENT DOCUMENTS

| | | | |
|---|---|---|---|
| 3,289,082 | 11/1966 | Shumate | 375/39 |
| 4,225,821 | 9/1980 | Carleson | 455/73 |
| 4,475,245 | 10/1984 | Iimura et al. | 455/73 |
| 4,501,018 | 2/1985 | Shanley et al. | 455/83 |
| 4,977,611 | 12/1990 | Maru | 455/343 |
| 4,982,442 | 1/1993 | Sarokhanian | 455/83 |
| 5,222,253 | 6/1993 | Heck | 455/78 |
| 5,239,689 | 8/1993 | Fukuda | 455/73 |
| 5,267,233 | 11/1993 | Bauershmidt | 370/29 |

FOREIGN PATENT DOCUMENTS 0331434  6/1989  European Pat. Off. .

OTHER PUBLICATIONS

Patent Abstracts Of Japan, vol. 10, No. 384, Dec. 23, 1986 "Radio Transmitter and Receiver".
Motorola Technical Developments, vol. 8, No. 1, Oct. 1988, p. 39, Schaumburg, Ill., U.S., "Fast Lock Time Front End For T. D. M.", by Jose I. Suarez.

Primary Examiner—Stephen Chin
Assistant Examiner—Amanda T. Le
Attorney, Agent, or Firm—Peter C. Toto; Jerry A. Miller

[57] ABSTRACT

A signal transmitting and receiving apparatus includes a transmitting circuit block which has a carrier signal supplying portion for supplying first and second carrier signals having the same frequency and a relative phase angle difference of substantially ninety degrees to be used for producing a transmissible digital phase-modulated signal. A receiving circuit block in which received digital data are obtained is based on a received digital phase-modulated signal, wherein the carrier signal supplying portion comprises a carrier signal generator for generating an additional carrier signal having a frequency twice as high as the frequency of each of the first and second carrier signals. A first flip-flop circuit produces the first carrier signal based on the additional carrier signal. A second flip-flop circuit produces the second carrier signal based on the additional carrier signal having been phase-inverted. A control unit causes the first and second flip-flop circuits to be operative when the signal transmitting operation is performed in the transmitting circuit block and to be inoperative when the signal receiving operation is performed in the receiving circuit block.

6 Claims, 2 Drawing Sheets

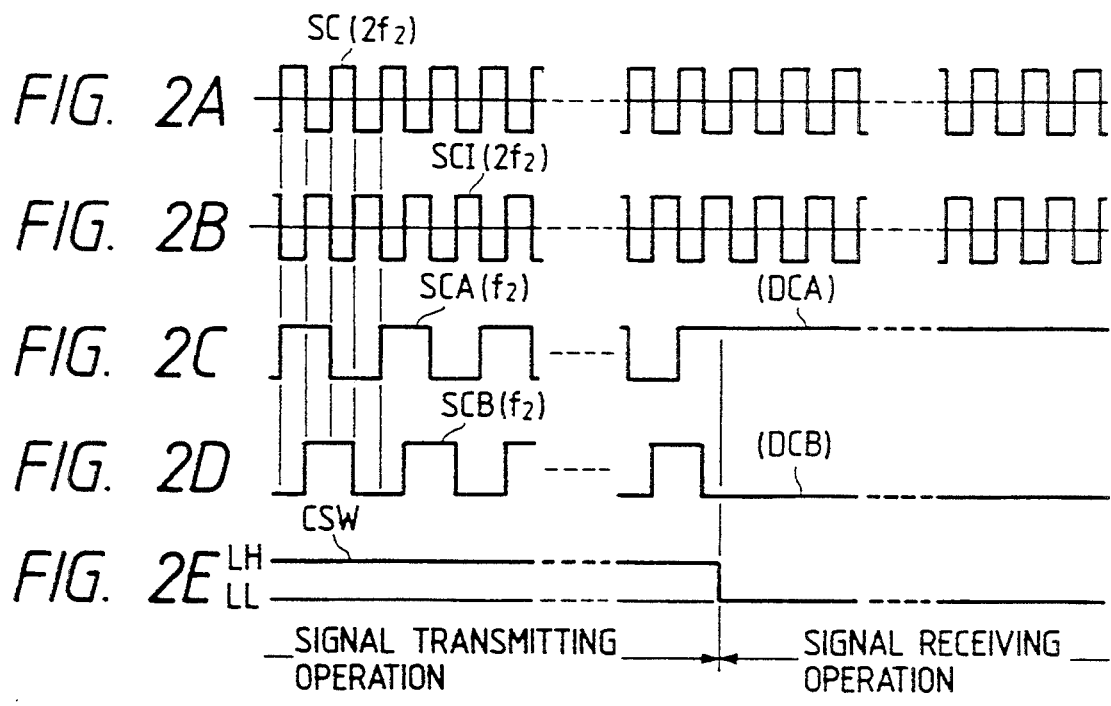
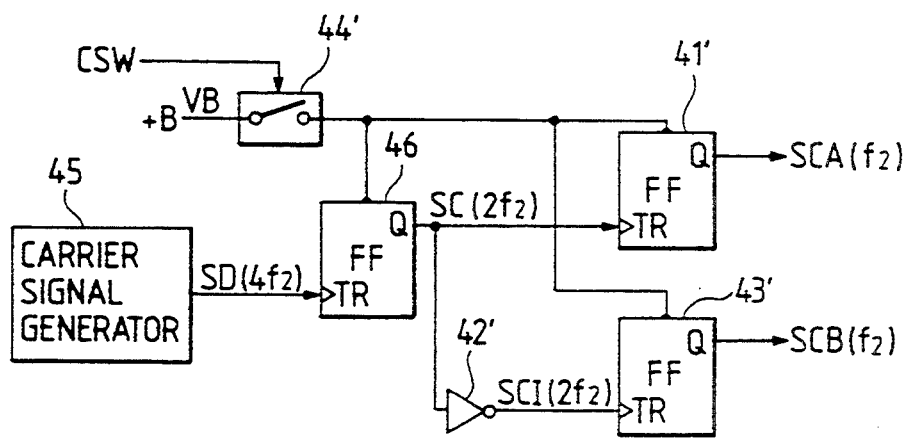

SIGNAL TRANSMITTING AND RECEIVING APPARATUS

BACKGROUND OF THE INVENTION

1. Field of the Invention

The present invention generally relates to signal transmitting and receiving apparatus. More particularly, the present invention is directed to improvements in a signal transmitting and receiving apparatus, such as a digital cordless telephone apparatus, which is operative to perform selectively a signal transmitting operation in which a transmissible digital phase-modulated signal is produced based on transmissible digital data and the transmissible phase-modulated signal is frequency-converted to be allocated in a higher frequency band with a predetermined carrier signal so as to be transmitted and a signal receiving operation in which a received digital phase-modulated signal is frequency-converted to be allocated in a lower frequency band with the predetermined carrier used in common to the signal transmitting operation and the signal receiving operation and received digital data are obtained based on the received digital phase-modulated signal having been frequency-converted.

2. Description of the Prior Art

There has been a proposal to adopt a time sharing multiplex communication system referred to as a TDD system or a TDMA system for communication between two digital cordless telephone apparatus, in which each of the digital cordless telephone apparatus is operative to perform alternately a signal transmitting operation and a signal receiving operation during the communication. The digital cordless telephone apparatus, by which the communication with the other is carried out in accordance with the time sharing multiplex communication system, is provided with a transmitting circuit block in which a digital phase-modulated signal is produced through phase-modulation effected with transmissible digital data in accordance with the quadrature phase shift keying and then frequency-converted into a transmissible digital phase-modulated signal allocated in a higher frequency band and the transmissible digital phase-modulated signal is transmitted therefrom, and also provided with a receiving circuit block in which a received digital phase-modulated signal is frequency-converted to be allocated in a lower frequency band and received digital data are obtained by phase-demodulating the received digital phase-modulated signal frequency-converted after reception.

In the phase-modulation effected in accordance with the quadrature phase shift keying in the transmitting circuit block, a couple of carrier signals for modulation having the same frequency and a relative phase angle difference of ninety degrees are provided and the transmissible digital data are reformed into a couple of parallel data by a parallel data generator. Then, one of the carrier signal is subjected to balanced-modulation with one of the parallel data to produce a first modulated signal and the other of the carrier signal is subjected to balanced-modulation with the other of the parallel data to produce a second modulated signal, so that there is a phase angle difference of ninety degrees between the first modulated signal and the second modulated signal. Accordingly, the first and second modulated signals constitute a pair of quadrature modulated signals and are mixed with each other to produce the digital phase-modulated signal obtained through the phase-modulation according to the quadrature phase shift keying. Further, in the phase-demodulation effected to the received digital phase-modulated signal having been frequency-converted in the receiving circuit block, the received digital phase-modulated signal is subjected to both phase-demodulations with a couple of carrier signals for demodulation having the same frequency and a relative phase angle difference of ninety degrees, respectively, so as to produce first and second demodulated signals. The first and second demodulated signals are mixed with each other to produce the received digital data.

The transmissible digital phase-modulated signal which is formed by frequency-converting the digital phase-modulated signal obtained through the phase-modulation according to the quadrature phase shift keying to be allocated in the higher frequency band, has the carrier frequency the same as the carrier frequency of the received digital phase-modulated signal. Then, for the purpose of simplification in circuit configuration and reduction in number of circuit parts and elements, a carrier signal for frequency-conversion used for frequency-converting the digital phase-modulated signal, which is obtained through the phase-modulation according to the quadrature phase shift keying, into the transmissible digital phase-modulated signal allocated in the higher frequency band and another carrier signal for frequency-conversion used for frequency-converting the received digital phase-modulated signal to be allocated in the lower frequency band are arranged to be generated by a single carrier signal generator provided in common to the transmitting circuit block and the receiving circuit block.

When digital data are transmitted and received in such a manner as mentioned above under a situation wherein each of the transmissible digital phase-modulated signal and the received digital phase-modulated signal has the same carrier frequency, and the carrier signal for frequency-conversion used for frequency-converting the digital phase-modulated signal into the transmissible digital phase-modulated signal allocated in the higher frequency band and the carrier signal for frequency-conversion used for frequency-converting the received digital phase-modulated signal to be allocated in the lower frequency band are arranged to be generated by the carrier signal generator provided in common to the transmitting circuit block and the receiving circuit block, the carrier frequency of the digital phase-modulated signal which is frequency-converted to be allocated in the higher frequency band in order to produce the transmissible digital phase-modulated signal is equal to the carrier frequency of the received digital phase-modulated signal frequency-converted to be the lower frequency band. Therefore, the frequency of each of the carrier signals for modulation having the same frequency and the relative phase angle difference of ninety degrees and used for the phase-modulation which is carried out in accordance with the quadrature phase shift keying to produce the digital phase-modulated signal is equal to the carrier frequency of the received digital phase-modulated signal frequency-converted to be allocated in the lower frequency band. This results in such a fear that each of the carrier signals for modulation which are generated to be used for the phase-modulation according to the quadrature phase shift keying in the transmitting circuit block is undesirably mixed up in the received digital phase-modulated signal frequency-converted to be allocated in the lower frequency band so as to raise noise obstructions when the signal receiving operation is performed in the receiving circuit block.

Accordingly, to avoid the undesirable noise obstructions thus brought about, it is required to prevent the carrier signals for modulation which are generated to be used for the phase-modulation according to the quadrature phase shift keying from being supplied to a modulating portion of the transmitting circuit block, in which the phase-modulation according to the quadrature phase shift keying is carried out, when the signal receiving operation is performed in the receiving circuit block.

A carrier signal generating portion of the transmitting circuit block for generating the carrier signals for modulation having the same frequency and the relative phase angle difference of ninety degrees is generally constituted to form a phase-locked loop configuration. In the carrier signal generating portion constituted to form the phase-locked loop configuration, a stabilized carrier signal oscillator which operates with oscillation frequency selected to coincide with the frequency of each of the carrier signals for modulation is provided and an output of the stabilized carrier signal oscillator is directly derived to serve as one of the carrier signals for modulation and derived through a phase-shifter for providing phase shift of ninety degrees to serve as the other of the carrier signals for modulation. Accordingly, by controlling the stabilized carrier signal oscillator to be operative during a period wherein the signal transmitting operation is performed in the transmitting circuit block and to be inoperative during a period wherein the signal receiving operation is performed in the receiving circuit block, the carrier signals for modulation can be prevented from being supplied to the modulating portion of the transmitting circuit block when the signal receiving operation is performed in the receiving circuit block.

However, although it is necessary for putting such control of the stabilized carrier signal oscillator as mentioned above into practice to change the stabilized carrier signal oscillator from operative to inoperative or from inoperative to operative within an extremely short period, it is quite difficult in practice to cause the stabilized carrier signal oscillator to have so quick changes in its condition as required. Consequently, in case of previously proposed digital cordless telephone apparatus, the carrier signals for modulation which are generated to be used for the phase-modulation according to the quadrature phase shift keying in the transmitting circuit block are not effectively controlled to be prevented from being supplied to the modulating portion of the transmitting circuit block and therefore the noise obstructions caused in the received digital phase-modulated signal by the carrier signals for modulation mixed up in the received digital phase-modulated signal are not sufficiently suppressed.

OBJECTS AND SUMMARY OF THE INVENTION

Accordingly, it is an object of the present invention to provide a signal transmitting and receiving apparatus, such as a digital cordless telephone apparatus, in which a transmitting circuit block for producing a digital phase-modulated signal through phase-modulation effected with a couple of carrier signals for modulation having the same frequency and a relative phase angle difference of substantially ninety degrees and digital data for modulating the carrier signals in accordance with the phase shift keying and for frequency-converting the phase-modulated signal to be allocated in a higher frequency band appropriate for transmission and a receiving circuit block for frequency-converting a received digital phase-modulated signal, which is formed through phase-modulation according to the quadrature phase shift keying, to be allocated in a lower frequency band and for phase-demodulating the received digital phase-modulated signal frequency-converted to be allocated in the lower frequency band to obtain received digital data, are provided, and the frequency-conversion in the transmitting circuit block and the frequency-conversion in the receiving circuit block are carried out with a carrier signal provided in common so that a signal transmitting operation and a signal receiving operation are alternately performed in the transmitting circuit block and the receiving circuit block, respectively, and which avoids the aforementioned problems and disadvantages encountered with the prior art.

Another object of the present invention is to provide a signal transmitting and receiving apparatus, such as a digital cordless telephone apparatus, in which a transmitting circuit block for producing a digital phase-modulated signal through phase-modulation effected with a couple of carrier signals having the same frequency and a relative phase angle difference of substantially ninety degrees and digital data for modulating the carrier signals in accordance with the phase shift keying and for frequency-converting the phase-modulated signal to be allocated in a higher frequency band appropriate for transmission and a receiving circuit block for frequency-converting a received digital phase-modulated signal, which is formed through phase-modulation according to the quadrature phase shift keying, to be allocated in a lower frequency band and for phase-demodulating the received digital phase-modulated signal frequency-converted to be allocated in the lower frequency band to obtain received digital data, are provided, and the frequency-conversion in the transmitting circuit block and the frequency-conversion in the receiving circuit block are carried out with a carrier signal provided in common, so that a signal transmitting operation and a signal receiving operation are alternately performed in the transmitting circuit block and the receiving circuit block, respectively, and which can suppress accurately and sufficiently noise obstructions caused in the received digital phase-modulated signal by the carrier signals for modulation mixed up in the received digital phase-modulated signal when the signal receiving operation is performed in the receiving circuit block.

A further object of the present invention is to provide a signal transmitting and receiving apparatus, such as a digital cordless telephone apparatus, in which a transmitting circuit block for producing a digital phase-modulated signal through phase-modulation effected with a couple of carrier signals for modulation having the same frequency and a relative phase angle difference of substantially ninety degrees and digital data for modulating the carrier signals in accordance with the phase shift keying and for frequency-converting the phase-modulated signal to be allocated in a higher frequency band appropriate for transmission and a receiving circuit block for frequency-converting a received digital phase-modulated signal, which is formed through phase-modulation according to the quadrature phase shift keying, to be allocated in a lower frequency band and for frequency-demodulating the received digital phase-modulated signal having been frequency-converted to obtain received digital data, are provided, and the frequency-conversion in the transmitting circuit block and the frequency-conversion in the receiving circuit block are carried out with a carrier signal provided in common, so that a signal transmitting operation and a signal receiving operation are alternately performed in the transmitting circuit block and the receiving circuit block, respectively, and which can control effectively the carrier signals for modulation so as to be supplied to a modulating portion of the transmitting circuit block when the signal transmitting operation is performed in the transmitting circuit block and to be prevented from being supplied to the modulating portion of the transmitting circuit block when the signal receiving operation is performed in the receiving circuit block.

According to the present invention, there is provided a signal transmitting and receiving apparatus includes a transmitting circuit block which has a carrier signal supplying portion for supplying first and second carrier signals having the same frequency and a relative phase angle difference of substantially ninety degrees, and in which the first and second carrier signals are amplitude-modulated with first and second digital data, respectively, to produce first and second amplitude-modulated signals, then the first and second amplitude-modulated signals are combined in a digital phase-modulated signal, and the digital phase-modulated signal is frequency-converted with a third carrier signal into a transmissible digital phase-modulated signal allocated in a higher frequency band to be transmitted, and a receiving circuit block in which a received digital phase-modulated signal is frequency-converted to be allocated in a lower frequency band and the received digital phase-modulated signal having been frequency-converted is phase-demodulated to produce received digital data, wherein a signal transmitting operation and a signal receiving operation are alternately performed in the transmitting circuit block and the receiving circuit block, respectively, and the carrier signal supplying portion includes a carrier signal generator for generating a fourth carrier signal having a frequency twice as high as the frequency of each of the first and second carrier signals, a first flip-flop circuit supplied with the fourth carrier signal to produce the first carrier signal based on the fourth carrier signal, a second flip-flop circuit supplied with the fourth carrier signal having been phase-inverted to produce the second carrier signal based on the phase-inverted fourth carrier signal, and a control unit for causing the first and second flip-flop circuits to be operative when the signal transmitting operation is performed in the transmitting circuit block and to be inoperative when the signal receiving operation is performed in the receiving circuit block.

In the signal transmitting and receiving apparatus thus constituted in accordance with the present invention, the carrier signal supplying portion of the transmitting circuit block is so controlled with relatively simple configuration as to supply certainly a signal modulating portion from which the digital phase-modulated signal is obtained with the first and second carrier signals having the same frequency and the relative phase angle difference of substantially ninety degrees so that the transmissible digital phase-modulated signal is correctly transmitted when the signal transmitting operation is performed in the transmitting circuit block and as to cease certainly to supply the signal modulating portion with the first and second carrier signals when the signal receiving operation is performed in the receiving circuit block. Accordingly, noise obstructions caused in the received digital phase-modulated signal by the first and second carrier signals for modulation mixed up in the received digital phase-modulated signal are surely and effectively suppressed.

The above, and other objects, features and advantages of the present invention will become apparent from the following detailed description which is to be read in conjunction with the accompanying drawings.

BRIEF DESCRIPTION OF THE DRAWINGS

FIGS. 2A to 2E are waveform diagrams used for explaining the operation of a carrier signal supplying portion of a transmitting circuit block provided in the embodiment shown in FIG. 1; and FIG. 3 is a circuit block diagram showing another example of carrier signal supplying portion of a transmitting circuit block provided in the embodiment shown in FIG. 1.

DESCRIPTION OF THE PREFERRED EMBODIMENTS

Figure 1:
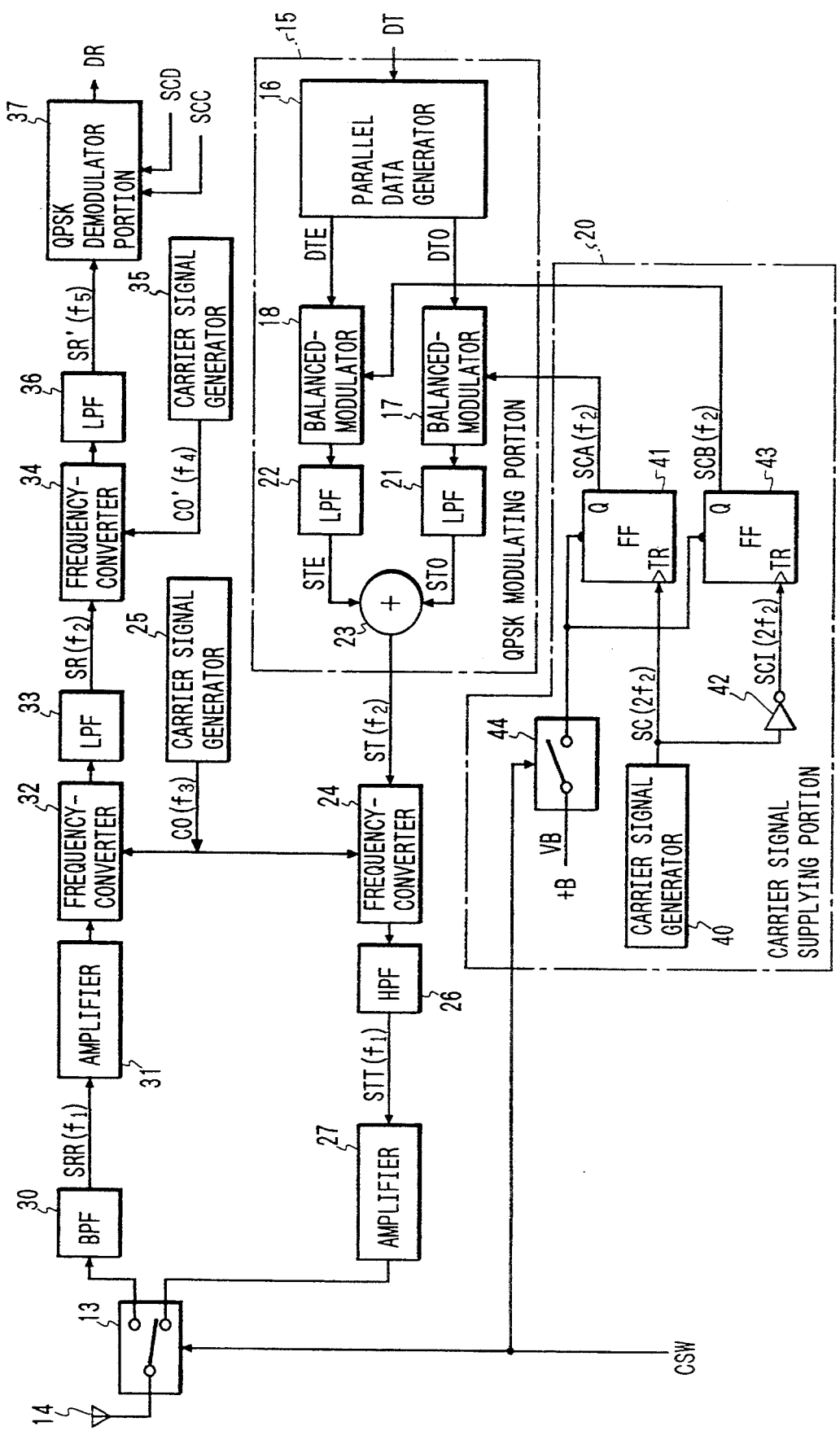
FIG. 1 is a circuit block diagram showing an embodiment of signal transmitting and receiving apparatus according to the present invention.

FIG. 1 shows an embodiment of transmitting and receiving apparatus according to the present invention, which is constituted to form a digital cordless telephone apparatus.

Referring to FIG. 1, a transmitting circuit block and a receiving circuit block are selectively connected through a switch 13 to a transmit-receive antenna 14. The switch 13 is controlled by a control signal CSW, which has a high level during a period wherein a signal transmitting operation is performed in the transmitting circuit block and a low level during a period wherein a signal receiving operation is performed in the receiving circuit block, to couple the transmitting circuit block with the transmit-receive antenna 14 when the control signal CSW has the high level and to couple the receiving circuit block with the transmit-receive antenna 14 when the control signal CSW has the low level. The period wherein the signal transmitting operation is performed in the transmitting circuit block and the period wherein the signal receiving operation is performed in the receiving circuit block, each of which is selected to be, for example, 1 millisecond, are successive alternately to leave a space of, for example, 50 microseconds between each adjoining two. Therefore, the switching operation of the switch 13 from the transmitting circuit block to the receiving circuit block or vice versa is carried out in accordance with the control signal CSW within a period corresponding to the space of, for example, 50 microseconds between the period wherein the signal transmitting operation is performed and the period wherein the signal receiving operation is performed.

In the transmitting circuit block, transmissible digital data DT are supplied to a parallel data generator 16 contained in a quadrature phase shift keying modulating portion 15 (hereinafter, referred to as a QPSK modulating portion 15). In the parallel data generator 16, each odd numbered bit of the transmissible digital data DT is converted into two bits arranged successively to produce first digital data DTO and each even numbered bit of the transmissible digital data DT is converted two bits arranged successively to produce second digital data DTE. The first and second digital data obtained from the parallel data generator 16, which form a couple of parallel data, are supplied to balanced-modulators 17 and 18.

A first carrier signal SCA for modulation and a second carrier signal SCB for modulation are also supplied from a carrier signal supplying portion 20 to the balanced-modulators 17 and 18, respectively. The first and second carrier signals SCA and SCB have the same frequency $f_2$ and a relative phase angle difference of substantially ninety degrees. In the balanced-modulator 17, the first carrier signal SCA is subjected to balanced amplitude-modulation with the first digital data DTO to produce a first amplitude-modulated signal STO. The first amplitude-modulated signal STO is supplied through a low pass filter (LPF) 21 to a mixer 23. Similarly, in the balanced-modulator 18, the second carrier signal SCB is subjected to balanced amplitude-modulation with the second digital data DTE to produce a second amplitude-modulated signal STE. The second amplitude-modulated signal STE is supplied through a LPF 22 to the mixer 23.

In the mixer 23, the first amplitude-modulated signal STO from the balanced-modulator 17 and the second amplitude-modulated signal STE from the balanced-modulator 18 are mixed with each other to produce a digital phase-modulated signal ST having a carrier frequency $f_2$. The digital phase-modulated signal ST is supplied to a frequency-converter 24 as an output of the QPSK modulating portion 15.

The frequency-converter 24 is also supplied with a carrier signal CO having a frequency $f_3$ and obtained from a carrier signal generator 25 which is constituted, for example, to form a frequency-synthesizer for generating the carrier signal CO as a stabilized signal. In the frequency-converter 24, the digital phase-modulated signal ST from the QPSK modulating portion 15 is frequency-converted with the carrier signal CO to be allocated in a higher frequency band. Thereby, a transmissible digital phase-modulated signal STT having a carrier frequency $f_1(=f_2+f_3)$ is derived through a high pass filter (HPF) 26 from the frequency-converter 24.

The transmissible digital phase-modulated signal STT obtained from the frequency-converter 24 is supplied through an amplifier 27 and the switch 13 to the transmit-receive antenna 14 and transmitted therefrom when the control signal CSW has the high level.

In the receiving circuit block, a digital phase-modulated signal having the carrier frequency $f_1$ is received by the transmit-receive antenna 14 and a received digital phase-modulated signal SRR is derived through the switch 13, a band pass filter (BPF) 30 and an amplifier 31 to a frequency-converter 32 when the control signal CSW has the low level.

The frequency-converter 32 is also supplied with the carrier signal CO having the frequency $f_3$ from the carrier signal generator 25. In the frequency-converter 32, the received digital phase-modulated signal SRR is frequency-converted with the carrier signal CO to be allocated in a lower frequency band. Thereby, a digital phase-modulated signal SR having the carrier frequency $f_2(=f_1-f_3)$ is derived through a LPF 33 from the frequency-converted 32 to be supplied to a frequency-converter 34. The carrier signal generator 25 for generating the carrier signal CO having the frequency $f_3$ is provided in common to the transmitting circuit block and the receiving circuit block.

The frequency-converter 34 is also supplied with a carrier signal CO' having a frequency $f_4$ from a carrier signal generator 35. In the frequency-converter 34, the digital phase-modulated signal SR is frequency-converted with the carrier signal CO' to produce a digital phase-modulated signal SR' having a carrier frequency $f_5(f_2-f_4)$. The digital phase-modulated signal SR' having the carrier frequency $f_5$ is derived through a LPF 36 from the frequency-converted 34 to be supplied to a quadrature phase shift keying demodulator 37 (hereinafter referred to as a QPSK demodulator 37). The QPSK demodulator 37 is also supplied with a couple of carrier signals SCC and SCD for demodulation each having a frequency $f_5$ and having a relative phase angle difference of substantially ninety degrees. In the QPSK demodulator 37, the digital phase-modulated signal SR' having been frequency-converted twice is subjected to demodulation with the carrier signals SCC and SCD serving as a couple of demodulation axes to produce a couple of demodulated output signals which are combined with each other to produce received digital data DR. The received digital data DR is derived from the QPSK demodulator 37.

The carrier signal supplying portion 20 of the transmitting circuit block comprises a carrier signal generator 40 for generating stably a carrier signal SC having a frequency $2f_2$ corresponding to twice as high as the frequency $f_2$ of each of the first and second carrier signals SCA and SCB for modulation, a first flip-flop circuit (FF) 41 having a trigger terminal (TR) to which the carrier signal SC from the carrier signal generator 40 is directly supplied, and a second flip-flop circuit (FF) 43 having a trigger terminal (TR) to which a phase-inverted carrier signal SCI obtained from an inverter 42 by which the carrier signal SC from the carrier signal generator 40 is phase-inverted is supplied. Each of the first and second flip-flop circuits 41 and 43 has a power source terminal to which a power supply voltage VB is supplied through a switch 44 controlled by the control signal CSW from a power source +B.

The switch 44 is put in the ON state to supply the power source terminal of each of the first and second flip-flop circuits 41 and 43 with the power supply voltage VB and thereby to cause the first and second flip-flop circuits 41 and 43 to be operative when the control signal CSW has the high level during the period wherein the signal transmitting operation is performed in the transmitting circuit block and is put in the OFF state to cease to supply the power source terminal of each of the first and second flip-flop circuits 41 and 43 with the power supply voltage VB and thereby to cause the first and second flip-flop circuits 41 and 43 to be inoperative when the control signal CSW has the low level during the period wherein the signal receiving operation is performed in the receiving circuit block.

In the carrier signal supplying portion 20 thus constituted, the carrier signal SC having the frequency $2f_2$, as shown in FIG. 2A, is directly supplied to the trigger terminal of the first flip-flop circuit 41. The first flip-flop circuit 41 is caused to be operative and triggered at every rising edge of the carrier signal SC to produce the first carrier signal SCA having the frequency $f_2$ which is obtained by reducing the frequency $f_2$ by a half, as shown in FIG. 2C, at an output terminal (Q) when the control signal CSW has a high level LH, as shown in FIG. 2E, during the period wherein the signal transmitting operation is performed in the transmitting circuit block, and caused to be inoperative so that a DC voltage DCA having a predetermined high level, as shown in FIG. 2C, is obtained at the output terminal, instead of the first carrier signal SCA, when the control signal CSW has a low level LL, as shown in FIG. 2E, during the period wherein the signal receiving operation is performed in the receiving circuit block.

Further, in the carrier signal supplying portion 20, the phase-inverted carrier signal SCI obtained from the inverter 42 to which the carrier signal SC is supplied from the carrier signal generator 40, which has the frequency $2f_2$ and the phase inverted in comparison with the phase of the carrier signal SC, as shown in FIG. 2B, is supplied to the trigger terminal of the second flip-flop circuit 43. The second flip-flop circuit 43 is caused to be operative and triggered at every rising edge of the phase-inverted carrier signal SCI to produce the second carrier signal SCB having the frequency $f_2$ which is obtained by reducing the frequency $f_2$ by a half and the phase angle different by ninety degrees from the phase angle of the first carrier signal SCA, as shown in FIG. 2D, at an output terminal (Q) when the control signal CSW has the high level LH, as shown in FIG. 2E, during the period wherein the signal transmitting operation is performed in the transmitting circuit block, and caused to be inoperative so that a DC voltage DCB having a predetermined low level, as shown in FIG. 2D, is obtained at the output terminal, instead of the second carrier signal SCB, when the control signal CSW has the low level LL, as shown in FIG. 2E, during the period wherein the signal receiving operation is performed in the receiving circuit block.

As described above, the first and second flip-flop circuits 41 and 43 in the carrier signal supplying portion 20 are operative to produce respectively the first and second carrier signals SCA and SCB each having the frequency $f_2$ and having the relative phase angle difference of substantially ninety degrees based on the carrier signal SC generated by the carrier signal generator 40 with the frequency $2f_2$ and to supply the QPSK modulating portion 15 with the first and second carrier signals SCA and SCB during the period wherein the signal transmitting operation is performed in the transmitting circuit block. Further, the first and second flip-flop circuits 41 and 43 are operative to cease certainly to supply the QPSK modulating portion 15 with the first and second carrier signals SCA and SCB during the period wherein the signal receiving operation is performed in the receiving circuit block. Therefore, the carrier signal supplying portion 20 is so controlled with relatively simple configuration as to supply certainly the QPSK modulating portion 15 with the first and second carrier signals SCA and SCB each having the frequency $f_2$ and having the relative phase angle difference of ninety degrees so that the digital phase-modulated signal ST having the carrier frequency $f_2$ is correctly obtained when the signal transmitting operation is performed in the transmitting circuit block and as to cease certainly to supply the QPSK modulating portion 15 with the first and second carrier signals SCA and SCB when the signal receiving operation is performed in the receiving circuit block. Consequently, noise obstructions caused in the digital phase-modulated signal SR by the first and second carrier signals SCA and SCB mixed up in the digital phase-modulated signal SR are surely and effectively suppressed.

FIG. 3 shows another embodied example of the carrier signal supplying portion 20 of the transmitting circuit block provided in the signal transmitting and receiving apparatus shown in FIG. 1.

The embodied example of the carrier signal supplying portion 20 comprises a carrier signal generator 45 for generating stably a carrier signal SD having a frequency $4f_2$ corresponding to four times as high as the frequency $f_2$ of each of the first and second carrier signals SCA and SCB for modulation and a flip-flop (FF) circuit 46 having a trigger terminal (TR) to which the carrier signal SD from the carrier signal generator 45 is supplied. An output terminal (Q) of the flip-flop circuit 46 is connected directly to a trigger terminal (TR) of a first flip-flop circuit 41' which corresponds to the first flip-flop circuit 41 shown in FIG. 1 and further connected through an inverter 42' which corresponds to the inverter 42 shown in FIG. 1 to a trigger terminal (TR) of a flip-flop circuit 43' which corresponds to the second flip-flop circuit 43 shown in FIG. 1. Each of the flip-flop circuits 41', 43' and 46 has a power source terminal to which the power supply voltage VB is supplied through a switch 44' which corresponds to the switch 44 shown in FIG. 1.

The switch 44' is put in the ON state to supply the power source terminal of each of the flip-flop circuits 41', 43' and 46 with the power supply voltage VB and thereby to cause the flip-flop circuits 41', 43' and 46 to be operative when the control signal CSW has the high level during the period wherein the signal transmitting operation is performed in the transmitting circuit block and is put in the OFF state to cease to supply the power source terminal of each of the flip-flop circuits 41', 43' and 46 with the power supply voltage VB and thereby to cause the flip-flop circuits 41', 43' and 46 to be inoperative when the control signal CSW has the low level during the period wherein the signal receiving operation is performed in the receiving circuit block.

With the configuration mentioned above, the flip-flop circuit 46 having the trigger terminal to which the carrier signal SD generated by the carrier signal generator 45 with the frequency $4f_2$ ks supplied is triggered at every rising edge of the carrier signal SD to produce the carrier signal SC having the frequency $2f_2$ which is obtained by reducing the frequency $4f_2$ by a half when the control signal CSW has the high level LH during the period wherein the signal transmitting operation is performed in the transmitting circuit block. Under a condition in which the control signal CSW has the high level LH, the carrier signal SC obtained from the output terminal of the flip-flop circuit 46 with the frequency $2f_2$ is supplied directly to the trigger terminal of the flip-flop circuit 41' and the phase-inverted carrier signal SCI obtained from the inverter 42' by which the carrier signal SC from the flip-flop circuit 46 is phase-inverted is supplied to the trigger terminal of the flip-flop circuit 43'. Therefore, the flip-flop circuits 41' and 43' operate in the same manner as the first and second flip-flop circuits 41 and 43 shown in FIG. 1 to supply the QPSK modulating portion 15 with the first and second carrier signals SCA and SCB for modulation, respectively.

On the other hand, under a condition in which the control signal CSW has the low level LL, each of the flip-flop circuits 41', 43' and 46 is caused to be inoperative so that the first and second carrier signals SCA and SCB are ceased to be supplied from the flip-flop circuits 41' and 43' to the QPSK modulating portion 15.

Accordingly, the embodied example of the carrier signal supplying portion 20 shown in FIG. 3 is also so controlled with relatively simple configuration as to supply certainly the QPSK modulating portion 15 with the first and second carrier signals SCA and SCB each having the frequency $f_2$ and having the relative phase angle difference of ninety degrees so that the digital phase-modulated signal ST having the carrier frequency $f_2$ is correctly obtained when the signal transmitting operation is performed in the transmitting circuit block and as to cease certainly to supply the QPSK modulating portion 15 with the first and second carrier signals SCA and SCB when the signal receiving operation is performed in the receiving circuit block. Consequently, noise obstructions caused in the digital phase-modulated signal SR by the first and second carrier signals SCA and SCB mixed up in the digital phase-modulated signal SR are surely and effectively suppressed.

In case of the embodied example of the carrier signal supplying portion 20 shown in FIG. 3, the carrier signal SC having the frequency $2f_2$ is produced by the flip-flop circuit 46 based on the carrier signal SD generated by the carrier signal generator 45 with the frequency $4f_2$ and the flip-flop circuits 41' and 43' are triggered by the carrier signal SC and the phase-inverted carrier signal SCI which is obtained by phase-inverting the carrier signal SC, respectively, the first and second carrier signals SCA and SCB for modulation can be correctly produced even though the carrier signal SD obtained from the carrier signal generator 45 has its pulse duty factor which is not exactly fifty percents.

What is claimed is:

1. A signal transmitting and receiving apparatus comprising:
    transmitting circuit means which has a carrier signal supplying portion for supplying first and second carrier signals having the same frequency and a phase angle difference of approximately ninety degrees, and in which the first and second carrier signals are amplitude-modulated with first and second digital data, respectively, to produce first and second amplitude-modulated signals, then the first and second amplitude-modulated signals, are combined as a quadrature-modulated signal, and the quadrature-modulated signal is frequency-converted with a third carrier signal supplied by a third carrier signal generating means into a transmissible digital phase-modulated signal allocated in a higher frequency band to be transmitted, and
    receiving circuit means in which a received digital phase-modulated signal is frequency-converted with said third carrier signal supplied by said third carrier signal generating means to be allocated in a lower frequency band and the received digital phase-modulated signal having been frequency-converted is phase-demodulated to produce received digital data,
    wherein a signal transmitting operation and a signal receiving operation are alternately performed in said transmitting circuit means and said receiving circuit means, respectively, and said carrier signal supplying portion comprises carrier signal generating means for generating a fourth carrier signal having a frequency twice as high as the frequency of each of the first and second carrier signals, a first flip-flop circuit supplied with the fourth carrier signal to produce the first carrier signal based on the fourth carrier signal, a second flip-flop circuit supplied with the fourth carrier signal having been phase-inverted to produce the second carrier signal based on the phase-inverted fourth carrier signal, and control means for causing the first and second flip-flop circuits to be operative when the signal transmitting operation is performed in the transmitting circuit means and to be inoperative when the signal receiving operation is performed in the receiving circuit means.

2. A signal transmitting and receiving apparatus according to claim 1, wherein said carrier signal generating means comprises a carrier signal generator for supplying directly a trigger terminal of the first flip-flop circuit with the fourth carrier signal and for supplying a trigger terminal of the second flip-flop circuit with the fourth carrier signal through an inverter for phase-inverting the fourth carrier signal.

3. A signal transmitting and receiving apparatus according to claim 1, wherein said carrier signal generating means comprises a carrier signal generator for generating a fifth carrier signal having a frequency four times as high as the frequency of each of the first and second carrier signals and a third flip-flop circuit supplied with the fifth carrier signal to produce the fourth carrier signal based on the fifth carrier signal.

4. A signal transmitting and receiving apparatus according to claim 3, wherein said third flip-flop circuit is connected to supply directly a trigger terminal of the first flip-flop circuit with the fourth carrier signal and to supply a trigger terminal of the second flip-flop circuit with the fourth carrier signal through an inverter for phase-inverting the fourth carrier signal.

5. A signal transmitting and receiving apparatus comprising:
    transmitting circuit means which has a carrier signal supplying portion for supplying first and second carrier signals having the same frequency and a phase angle difference of approximately ninety degrees, and in which the first and second carrier signals are amplitude-modulated with first and second digital data, respectively, to produce first and second amplitude-modulated signals, then the first and second amplitude-modulated signals, are combined as a quadrature-modulated signal, and the quadrature-modulated signal is frequency-converted with a third carrier signal supplied by a third carrier signal generating means into a transmissible digital phase-modulated signal allocated in a higher frequency band to be transmitted, and
    receiving circuit means in which a received digital phase-modulated signal is frequency-converted with said third carrier signal supplied by said third carrier signal generating means to be allocated in a lower frequency band and the received digital phase-modulated signal having been frequency-converted is phase-demodulated to produce received digital data,
    wherein a signal transmitting operation and a signal receiving operation are alternately performed in said transmitting circuit means and said receiving circuit means, respectively, and said carrier signal supplying portion comprises carrier signal generating means for generating a fourth carrier signal having a frequency twice as high as the frequency of each of the first and second carrier signals, a first flip-flop circuit supplied with the fourth carrier signal to produce the first carrier signal based on the fourth carrier signal, a second flip-flop circuit supplied with the fourth carrier signal having been phase-inverted to produce the second carrier signal based on the phase-inverted fourth carrier signal, and control means for causing the first and second flip-flop circuits to be operative when the signal transmitting operation is performed in the transmitting circuit means and to be inoperative when the signal receiving operation is performed in the receiving circuit means, said control means comprising a switch operative to supply each of the first and second flip-flop circuits with power supply voltage when the signal transmitting operation is performed in the transmitting circuit means and to cease to supply each of the first and second flip-flop circuits with the power supply voltage when the signal receiving operation is performed in the receiving circuit means.

6. A signal transmitting and receiving apparatus comprising:

transmitting circuit means which has a carrier signal supplying portion for supplying first and second carrier signals having the same frequency and a phase angle difference of approximately ninety degrees, and in which the first and second carrier signals are amplitude-modulated with first and second digital data, respectively, to produce first and second amplitude-modulated signals, then the first and second amplitude-modulated signals, are combined as a quadrature-modulated signal, and the quadrature-modulated signal is frequency-converted with a third carrier signal supplied by a third carrier signal generating means into a transmissible digital phase-modulated signal allocated in a higher frequency band to be transmitted, and receiving circuit means in which a received digital phase-modulated signal is frequency-converted with said third carrier signal supplied by said third carrier signal generating means to be allocated in a lower frequency band and the received digital phase-modulated signal having been frequency-converted is phase-demodulated to produce received digital data, wherein a signal transmitting operation and a signal receiving operation are alternately performed in said transmitting circuit means and said receiving circuit means, respectively, and said carrier signal supplying portion comprises carrier signal generating means for generating a fourth carrier signal having a frequency twice as high as the frequency of each of the first and second carrier signals and for generating a fifth carrier signal having a frequency four times as high as the frequency of each of the first and second carrier signals, a first flip-flop circuit supplied with the fourth carrier signal to produce the first carrier signal based on the fourth carrier signal, a second flip-flop circuit supplied with the fourth carrier signal having been phase-inverted to produce the second carrier signal based on the phase-inverted fourth carrier signal, a third flip-flop circuit supplied with the fifth carrier signal to produce the fourth carrier signal based on the fifth carrier signal, and control means for causing the first and second flip-flop circuits to be operative when the signal transmitting operation is performed in the transmitting circuit means and to be inoperative when the signal receiving operation is performed in the receiving circuit means, said control means comprising a switch operative to supply each of the first, second and third flip-flop circuits with power supply voltage when the signal transmitting operation is performed in the transmitting circuit means and to cease to supply each of the first, second and third flip-flop circuits with the power source voltage when the signal receiving operation is performed in the receiving circuit means.

* * * * *